Figure 1:
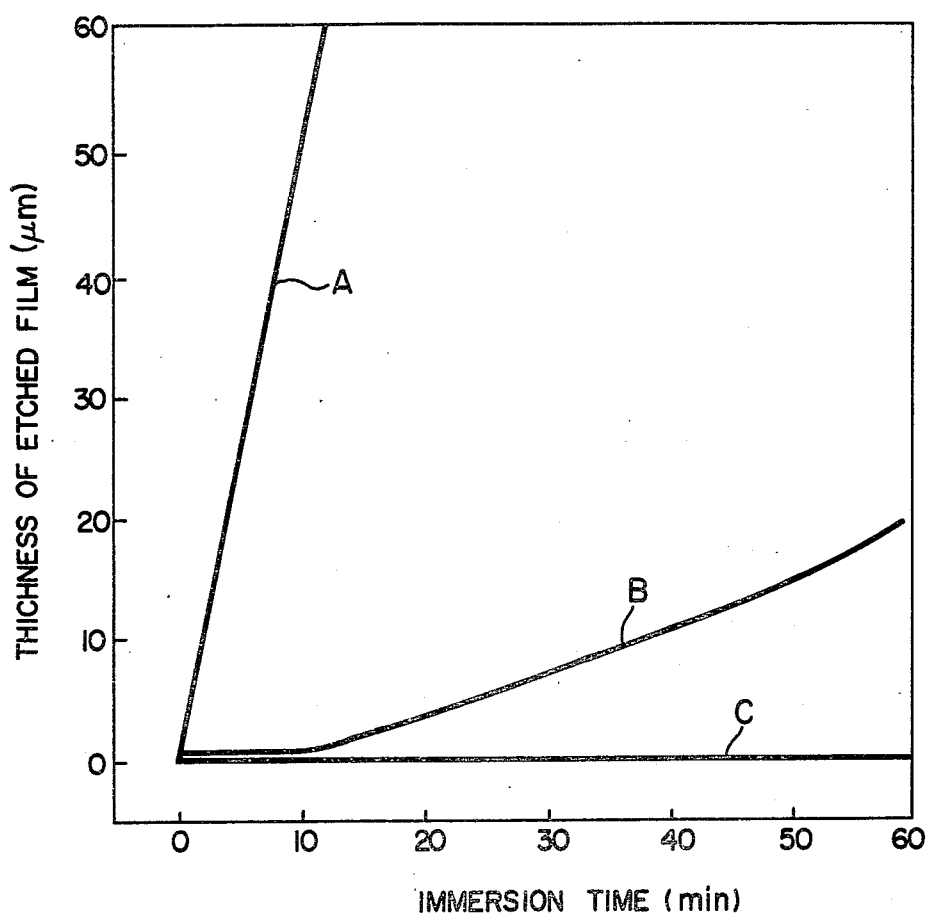

United States Patent [19]
Yamaoka et al.

[11] 4,431,478
[45] Feb. 14, 1984

[54] ETCHING AGENT FOR POLYIMIDE TYPE RESINS AND PROCESS FOR ETCHING POLYIMIDE TYPE RESINS WITH THE SAME

[75] Inventors: Shigenori Yamaoka, Yokohama; Kenmatsu Isozaki, Toride; Kyotaro Nishi, Tokyo; Yukihiro Okabe, Yokohama; Mitsutaka Waki, Yokohama; Masuo Mizuno, Yokohama, all of Japan

[73] Assignee: Sumitomo Bakelite Co. Ltd., Japan

[21] Appl. No.: 445,408

[22] Filed: Nov. 30, 1982

[30] Foreign Application Priority Data

Dec. 2, 1981 [JP] Japan .................................. 56-192959

[51] Int. Cl.³ ........................ B29C 17/08; B44C 1/22; C03C 15/00; C03C 25/06
[52] U.S. Cl. .................................... 156/668; 156/655; 156/659.1; 252/79.5
[58] Field of Search ...................... 156/654, 655, 659.1, 156/640, 668; 252/79.5

[56] References Cited
U.S. PATENT DOCUMENTS 3,361,589  1/1968  Lindsey .......................... 156/629 X
3,871,930  3/1975  Fish ................................ 252/79.5 X
4,369,090  1/1983  Wilson et al. .................... 156/668 X Primary Examiner—William A. Powell Attorney, Agent, or Firm—Karl W. Flocks; Sheridan Neimark

[57] ABSTRACT

Polyimide-type-resin-etching rate can remarkably be enhanced by combining tetramethylammonium hydroxide or an aqueous solution of tetramethylammonium hydroxide with at least one member selected from the group consisting of amide compounds represented by the following formula:

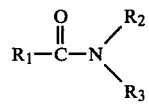

and amide compounds represented by the following formula:

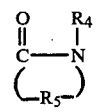

and amine compounds represented by the following formula:

$H_2N-R_6-NH_2$ as an etching assistant.

21 Claims, 2 Drawing Figures

ETCHING AGENT FOR POLYIMIDE TYPE RESINS AND PROCESS FOR ETCHING POLYIMIDE TYPE RESINS WITH THE SAME

This invention relates to an etching agent and a process for etching polyimide type resins having polyimide ring.

Polyimide type resins are used in various fields as heat-resistant film, insulating varnish, coating material, molded article and the like owing to their excellent heat resistance, electrical properties, chemical resistance, etc. However, with an expansion of the use of polyimide type resins, there have developed various uses in which a part of the polyimide type resin is etched off and the remaining part is used. As such an etching solution, an aqueous solution of alkali or hydrazine has been used hitherto.

However, aqueous alkali solutions usually employed, i.e. an aqueous solution of sodium hydroxide and an aqueous solution of potassium hydroxide, have only a small etching ability in the neighborhood of room temperature and are used only for roughening the surface of a polyimide film. Even if they are used at a high concentration and a high temperature in order to enhance their etching ability, it is still difficult to completely etch off a polyimide film with them. Further, a strongly alkaline vapor is evolved under such conditions, which makes it difficult to put such a method in practical use.

On the other hand, hydrazine has been used for the formation of a through-hole in polyimide film at the time of producing a printed circuit board. However, the etching behavior of hydrazine on polyimide type resin is such that a rapid etching progresses after a long induction period. Thus, for example, in the case of patterning a polyimide film by making through-holes therein, the hydrazine permeates into a portion under an etching resist film during the long induction period, and therefore, even the portion which does not require etching becomes often dissolved by the subsequently caused rapid etching action, which is the so-called overetching. Accordingly, hydrazine is unsuitable for uses requiring a patterning of high accuracy. As a method for shortening the induction period, there has been proposed development which comprises adding a modifying agent such as an amine or the like. However, hydrazine itself has a serious fault in handling. This fault is that hydrazine has so strong a toxicity that when only a slight quantity of hydrazine vapor contacts skin, the skin is completely damaged, and when hydrazine vapor contacts hair, the hair is rapidly reddened, and when hydrazine vapor is inhaled mucous membranes are extremely damaged. Therefore, the handling of hydrazine in practice is quite difficult.

The use of hydrazine has already been banned officially in California, USA.

Thus, the object of this invention is to provide an etching solution which is free from hydrazine, which has an enhanced etching ability (the conventional etching solutions composed of an aqueous alkali solution or a modified product thereof are disadvantageous in that they have low etching ability), which can rapidly etch a polyimide type resin with high accuracy and which is non-toxic and applicable to practical use.

According to this invention, there is provided an etching solution for polyimide type resins which comprises tetramethylammonium hydroxide (hereinafter, referred to as TMA) or an aqueous solution thereof and an etching assistant consisting of at least one amine compound represented by the formula:

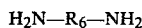

wherein $R_6$ is an alkyl group having one or more carbon atoms, and at least one amide compound selected from the group consisting of compounds represented by the formula:

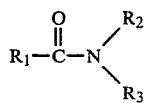

wherein $R_1$ is a hydrogen atom or an alkyl group having one or more carbon atoms, and $R_2$ and $R_3$ represent alkyl groups having one or more carbon atoms, and compounds represented by the formula:

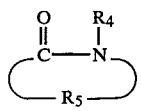

wherein $R_4$ and $R_5$ represent alkyl groups having one or more carbon atoms; as well as a process for etching a polyimide type resin with said etching solution.

Attention is now directed to an aqueous solution of TMA as a new etchant for polyimide type resin capable of being substituted for the hydrazine type etchant. By utilizing this action, an aqueous solution of TMA has already been used as a developer for positive type resist inks. The mechanism by which polyimide type resin is etched with TMA is considered to be that TMA decomposes and cuts the polyimide ring to convert the polyimide type resin into an amine and a low molecular weight polyimide type resin, and this low molecular weight polyimide resin is dissolved in TMA, whereby the etching is effected.

However, the power of TMA dissolving polyimide type resin is so small that the polyimide type resin can be dissolved therein only after the polyimide type resin has been decomposed to a stage close to monomer. Accordingly, the polyimide-type-resin-etching rate of TMA is so low that, for example, it takes about 150 minutes for completely etching a polyimide film having a thickness of 50 μm. Thus, TMA is not suitable for etching a thick coating film of polyimide.

On the other hand, the mechanism by which the etching solution mixture of this invention etches a polyimide type resin is considered to be that the polyimide type resin, in the stage that the imide ring has been decomposed and cut by TMA to some extent but has not been converted into a low molecular wieght resin, is dissolved in the amide or amine compound used in this invention owing to the strong dissolving power of the amide or amine compound, thereby etching the resin.

Accordingly, the etching solution of this invention exhibits a very high polyimide-type-resin-etching rate. For example, it can completely etch a polyimide film having a thickness of 50μ in about 10 minutes. Thus, it is quite practically applicable not only to the etching of a thin coating film of polyimide type resin but also to the etching of a thick coating film of polyimide type resin. In addition, it is excellent in accuracy of etching.

Further, when used for the etching of polyimide type resins having amide group, ester group or the like in addition to imide ring or to the etching of polyimide type resins prepared by blending a polyimide type resin with an epoxy resin, a phenoxy resin or the like, an etching solution composed only of TMA or its aqueous solution can etch these polyimide type resins only very slowly or cannot etch them because TMA has only a decomposing activity upon the imide ring and therefore it can convert the polyimide type resin to a low molecular weight resin only very slowly. On the contrary, the etching solution mixture used in this invention dissolves or etches the polyimide type resin which has not yet been decomposed to the stage of a low molecular weight compound, so that it can rapidly etch even the above-mentioned polyimide type resins.

An etching solution consisting of only an amide compound and/or an amine compound and being free from TMA has no imide-ring-decomposing and cutting ability, and hence, has no polyimide-type-resin-etching ability.

Amide compounds which can be used in this invention include amide compounds represented by the formula:

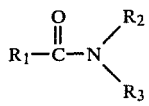

wherein $R_1$ is a hydrogen atom or an alkyl group having one or more carbon atoms and $R_2$ and $R_3$ are alkyl groups having one or more carbon atoms, for example, N,N-dimethylformamide, N,N-diethylformamide, N,N-dimethylacetamide, N,N-diethylacetamide, N,N-dimethylpropionamide, N,N-dimethylbutyramide, N,N-diethylbenzamide, diethylcarbamazine and the like; and amide compounds represented by the formula:

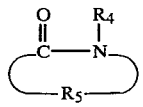

wherein $R_4$ and $R_5$ are alkyl groups having one or more carbon atoms, for example, N-methyl-2-pyrrolidone, N-ethyl-2-pyrrolidone and the like. Among these amide compounds, N,N-dimethylacetamide, N,N-dimethylformamide, N-methyl-2-pyrrolidone and N-ethyl-2-pyrrolidone are particularly effective.

Though the following amide compounds have very similar structures, they have substantially no effect:

Amide compounds represented by the formula:

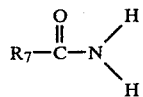

wherein $R_7$ is a hydrogen atom or an alkyl group having one or more carbon atoms, for example, formamide, acetamide, propionamide, butyramide and the like.

Monoalkyl-substituted compounds represented by the formula:

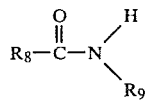

wherein $R_8$ is a hydrogen atom or an alkyl group having one or more carbon atoms and $R_9$ is an alkyl group having one or more carbon atoms, for example, N-monomethylformamide, N-monoethylformamide, N-monomethylacetamide, N-monoethylacetamide, N-monomethylpropionate, N-monoethylbenzamide and the like.

Amide compounds represented by the formula:

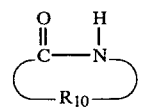

wherein $R_{10}$ is an alkyl group having one or more carbon atoms, for example, 2-pyrrolidone and the like. This is because by the action of the hydrogen atom attached to the N atom, these amide compounds decompose TMA into ammonia whereby TMA is deactivated.

As the amine compound, there may be used compounds represented by the formula:

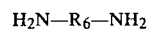

$$H_2N-R_6-NH_2$$

wherein $R_6$ is an alkyl group having one or more carbon atoms, for example, methylenediamine, ethylenediamine, trimethylenediamine, propylenediamine, tetramethylenediamine, hexamethylenediamine, pentamethylenediamine, dimethylenediamine and the like. Among these amine compounds, ethylenediamine and hexamethylenediamine have a particularly great effect.

As TMA, there may be used $[(CH_3)_4N]^+OH^-$ and its aqueous solution $C_4H_{13}NO.5H_2O$ and its aqueous solution $C_4H_{13}NO.3H_2O$ and its aqueous solution, and $C_4H_{13}NO.H_2O$ and its aqueous solution, among which an aqueous solution of $[(CH_3)_4N]^+OH^-$ is excellent in availability and also in etching effect.

The etching solution of this invention is so formulated that the amount of TMA becomes 0.1–200 parts by weight and the amount of water becomes 0–1,500 parts by weight, per 100 parts by weight of the total amount of the etching assistants (amide compound and/or amine compound). At this ratio, an excellent effect can be obtained. A preferable formulation is that the amount of TMA is 0.5–50 parts by weight and the amount of water is 20–1,000 parts by weight, per 100 parts by weight of the total amount of the etching assistants. At this ratio, the etching solution exhibits a particularly great effect.

If the amount of TMA is less than 0.1 part by weight, the action of decomposing and cutting polyimide ring is too small, so that the etching ability is unsatisfactory.

If the amount of TMA is more than 200 parts by weight, such an etching solution can decompose and cut a polyimide ring to form a low molecular weight polyimide resin but the etching solution has no ability to dissolve the latter. Therefore, the etching ability of the etching solution is insufficient.

One of the important characteristic features of the etching solution used in this invention is that it can etch not only polyimide resins but also other polyimide type resins having imide ring.

The term "polyimide type resin" used herein involves imide ring-containing resins such as polyimide resin, polyamide-imide resin, polyester-imide resin, polyamide-ester-imide resin, polybenzoxazole-imide resin, polyimidazopyrrolone resin and the like, as well as resins blends of these resins with an epoxy resin, a phenolic resin, a phenoxy resin and the like. If TMA or its aqueous solution is used alone for etching such polyimide type resins having a low imide ring content its etching ability is very low. However, the etching solution used in this invention has a sufficient ability to etch these reins.

The etching process of this invention comprises contacting a cured product of a polyimide type resin with the etching solution of this invention by, for example, dipping, spraying or the like. Though the etching can sufficiently be performed at room temperature, the temperature of the etching solution may be elevated when a higher etching rate is required. For example, at 40°–80° C., the etching progresses much more speedily than at room temperature.

If etching is performed in the semi-cured state of a polyimide type resin or in the state that the polyimide type resin is not yet cured completely, the etching rate is several times that in the completely cured state. For example, in the case of a polyimide resin formed by the reaction of pyromellitic acid and a diamine, the etching rate becomes higher if etching is carried out before all imide rings are formed, namely in the state that the starting materials are preliminarily heated at 100°–150° C. for about 30 minutes and polyamic acid still remains. After the etching, final curing is performed.

When it is intended that only a part of the polyimide type resin is etched, it is possible to coat a photosensitive resist ink on the surface of the polyimide type resin and then etch only the necessary part according to the usual circuit processing technique.

The etching process of this invention can be applied to various products in which polyimide type resins are etched. For example, as a protecting film for the surface of semi-conductor, polyimide type resin is currently used for the formation of heat resistant and moisture resistant insulating coatings for passivation, for multilayer circuit or for α ray shielding. In these uses, only the bonding pad part must be etched in accordance with need, and the etching solution of this invention can be used for such an etching. Particularly, for the α ray shielding, a thick film having a thickness of about 10–100μ is necessary, which can be etched with the etching solution of this invention in a short period of time with a high accuracy. The etching solution of this invention can also be used for the partial etching, in connecting a polyimide-film-based flexible printed board on its backside or at its terminal part. As one method for mounting IC or LSI, a tape carrier method is now attractive, and a polyimide film is often used as the carrier tape in said method. In such cases, the polyimide film must be etched partially, and the etching solution used in this invention is hopeful as an etching solution quite useful for this processing.

Figure 2:
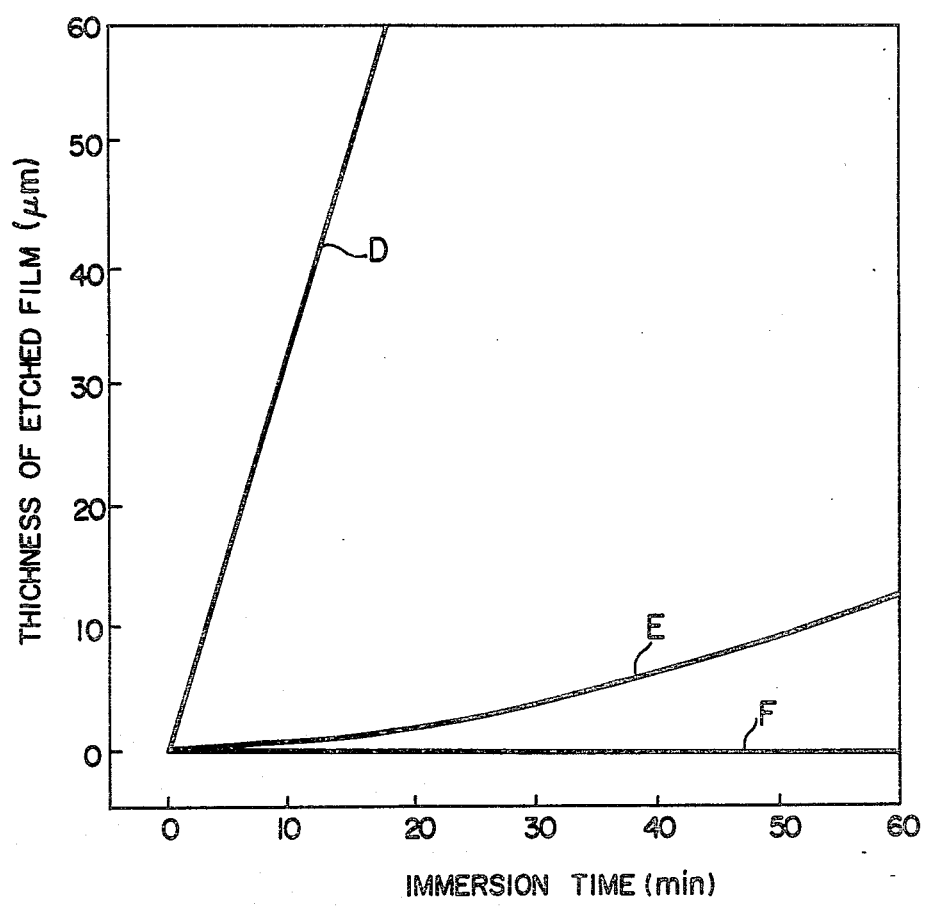

This invention will further be explained below referring to Examples and the accompanying drawings. In the drawings, FIG. 1 and FIG. 2 are graphs illustrating the relation between immersion time and thickness of etched film in Example 1 and Example 2, respectively.

EXAMPLE 1

An etching solution was prepared by blending 40 parts by weight of dimethylacetamide and 60 parts by weight of ethylenediamine with a solution of 10 parts by weight of TMA in 300 parts by weight of water.

On the other hand, 50 parts by weight of diaminodiphenyl ether was reacted with 55 parts by weight of pyromellitic anhydride in N-methyl-2-pyrrolidone at 50° C. for 3 hours to obtain a polyimide resin varnish containing 20% of polyamic acid. This varnish was cast on an aluminum foil and heated at 150° C. for 60 minutes to form a semi-cured polyimide coating film having a thickness of about 50 μm. This polyimide film was cut into 100 mm squares, and the cut pieces were immersed into the above-mentioned etching solution at 50° C. to investigate the relation between immersion time and quantity of etching.

Curve A of FIG. 1 shows the results obtained.

Further, for comparison, the same polyimide resin film as above was immersed at 50° C. in an etching solution having the same composition as that used in Example 1, except that the dimethylacetamide and ethylenediamine had been omitted, i.e. an etching solution consisting only of TMA and water. Curve B of FIG. 1 shows the results obtained.

Further, for comparison, the same polyimide resin film as above was immersed at 50° C. in an etching solution having the same composition as that used in Example 1, except that the TMA and water had been omitted, i.e. an etching solution consisting only of the amine compound and the amide compound. Curve C of FIG. 1 shows the results obtained. As is apparent from FIG. 1, TMA/water system (Curve B) is impractical in that it necessitates so long a period of time as about 150 minutes for etching a film having a thickness of 50 μm. In the amine compound-amide compound system (Curve C), the quantity of etching is zero.

The etching solution used in this invention exhibits so high an etching rate that it etches a coating film having a thickness of 50 μm in about 10 minutes. It is understandable that the combination of TMA and the amine compound and/or the amide compound exhibits an excellent etching ability owing to their remarkable synergistic effect.

EXAMPLE 2

An etching solution was prepared by blending 100 parts by weight of N-methyl-2-pyrrolidone with a solution of 5 parts by weight of TMA in 200 parts by weight of water.

On the other hand, 35 parts by weight of diphenylmethane diisocyanate and 25 parts by weight of trimellitic anhydride were reacted at 150° C. for 5 hours in N-methyl-2-pyrrolidone to obtain a polyamide-imide varnish having a concentration of 20%. The varnish was cast on an aluminum foil and heated at 150° C. for 60 minutes to form a semi-cured polyamide-imide coating film having a thickness of about 50 μm. The polyamide-imide film was cut into 100-mm squares and immersed in the above-mentioned etching solution at 50° C. to investigate the relation between immersion time and thickness of etched film. Curve D of FIG. 2 shows the results obtained.

For comparison, the same polyamide-imide resin film as above was immersed at 50° C. in an etching solution having the same composition as used in Example 2, except that the N-methyl-2-pyrrolidone was omitted, i.e. an etching solution consisting only of TMA and water. Curve E of FIG. 2 shows the results obtained.

Further, for comparison, the same polyamide-imide resin film as above was immersd at 50° C. in an etching solution having the same composition as used in Example 2, except that the TMA and water were omitted, i.e. an etching solution consisting only of the amide compound. Curve F of FIG. 2 shows the results obtained.

As is apparent from FIG. 2, the results are just the same as in Example 1, even if the resin film to be etched is changed from the polyimide of Example 1 to the polyamide-imide of Example 2, and TMA alone or the amide compound alone is entirely ineffective or has only a very low etching ability. The etching solution used in this invention exhibits a remarkable synergistic effect between them.

EXAMPLE 3

A polyimide varnish having a concentration of 20% and a viscosity of 5,000 cps was prepared by the same procedure as in Example 1. The polyimide varnish was coated on a $SiO_2$-deposited silicon wafer by means of a spinner at a revolution speed of 500 r.p.m. for a period of 10 seconds, and then heated at 150° C. for 60 minutes. At this time, the thickness of the resin film was about 50 μm.

Then, on this resin film, a photoresist manufactured by Tokyo Oka Kogyo K. K. (OMR-#83; viscosity 35 cps) was coated by means of a spinner at a revolution speed of 5,000 r.p.m., and dried at 100° C. for 30 minutes. At this time, the resist had a thickness of 6,000 Å. After placing a negative mask thereover so that the mask came into a close contact with the resist, the resist was exposed to ultraviolet rays, developed with a developer for OMR to form the intended pattern, and thereafter heated at 150° C. for 30 minutes. Then, the resist was immersed at 50° C. for 12 minutes in an etching solution prepared by blending 100 parts by weight of hexamethylenediamine with a solution of 30 parts by weight of TMA in 50 parts by weight of water, after which it was immersed in a peeling solution for OMR heated to 90° C. in order to remove the resist. As a result, a negative mask having a dimension of 50 μm gave an etched open hole having a dimension of 53 μm, demonstrating the high accuracy of etching.

On the other hand, when the resist was immersed in hydrazine hydrate in place of the abovementioned etching solution, no open hole was formed even after immersion at 50° C. for 12 minutes, and an open hole was formed for the first time after immersion for 50 minutes. However, the dimension of the open hole produced from a negative mask having a dimension of 50 μm was 120 μm. Further, because of the quite strong toxicity of hydrazine, a particular attention was necessary for the work in order to prevent the inhalation of any slight quantity of vaporized hydrazine gas, which made the work difficult.

As above, the etching solution used in this invention exhibits not only a high etching rate but also a high accuracy of etching. Therefore, it is suitable for use as an etching solution for etching an organic heat resistant resin when the resin is used as a protective coating film, an insulating layer or an α ray shielding layer in semiconductor integral circuits.

EXAMPLE 4

The polyimide resin varnish obtained in Example 1 was cast on a copper foil having a thickness of 35 μm by meams of a roll coater. It was heated first at 150° C. for 60 minutes and then at 350° C. for 30 minutes in a nitrogen atmosphere to form a cured coating film of the polyimide resin having a thickness of about 50 μm. On the surface of this copper foil, a flexible printing plate was formed according to a usual process for making a printing plate.

The printing plate had a shape of the so-called tape carrier, the terminals of which were concentrically placed at its center so as to mount semi-conductor thereon. In order to connect the terminal of this printing plate with the terminal of semi-conductor, the polyimide resin coating on the backside of the terminal of the printing plate had to be etched, and for this purpose, only the polyimide coating film on the terminal part was etched by the same procedure as in Example 3. The same etching solution as in Example 1 was used at 50° C. As a result, it took about 25 minutes to etch a coating film having a thickness of about 50 μm. The etching time was longer than that in Example 1, because in this Example a completely cured resin coating film was etched. The etching accuracy was so high that a negative mask having a dimension of 120 μm gave an etched open hole having a dimension of 125 μm.

For comparison, the same resin coating film as above was immersed at 50° C. for 25 minutes in a 15% aqueous solution of sodium hydroxide (very strong alkali) which has hitherto been said to be usable as an etching solution for a polyimide type resin coating film. As a result, etching scarcely took place. When the temperature was elevated to 70° C., about 100 minutes was necessary for etching the film having a thickness of 50 μm. In addition, a negative mask having a dimension of 120 μm gave an etched open hole having an impractically large open hole of 200 μm. Further, since a temperature as high as 70° C. was employed in the work, a strongly alkaline gas was always evolved to pollute the environments and made the mass production quite difficult. Though an etching solution composed of sodium hydroxide can etch a very thin film of a polyimide type resin, but cannot etch such a thick film as used in this Example.

The etching solution of this Example can etch a thick polyimide film such as a flexible printing plate at a low temperature with a high accuracy. In addition, unlike hydrazine, it is not poisonous. Therefore, it is an etching solution suitable for practical use and excellent in workability.

What is claimed is:

1. An etching agent for polyimide type resins consisting essentially of
   (1) tetramethylammonium hydroxide or an aqueous solution of tetramethylammonium hydroxide and
   (2) an etching assistant consisting of
      (a) at least one amine compound represented by the formula,

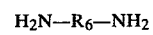

wherein $R_6$ is an alkyl group having one or more carbon atoms and
      (b) at least one amide compound selected from the group consisting of compounds represented by the formulas:

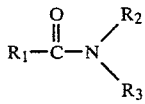

wherein $R_1$ is a hydrogen atom or an alkyl group having one or more carbon atoms, and $R_2$ and $R_3$ are alkyl groups having one or more carbon atoms, and

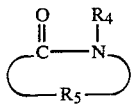

wherein $R_4$ and $R_5$ represent alkyl groups having one or more carbon atoms.

2. An etching agent according to claim 1, wherein said tetramethylammonium hydroxide is $[(CH_3)_4N]^+OH^-$, $C_4H_{13}NO \cdot 5H_2O$, $C_4H_{13}NO \cdot 3H_2O$ or $C_4H_{13}NO \cdot H_2O$.

3. An etching agent according to claim 1 or 2, wherein said at least one amide compound is selected from the group consisting of N,N-dimethylacetamide, N,N-dimethylformamide, N-methyl-2-pyrrolidone and N-ethyl-2-pyrrolidone.

4. An etching agent according to claim 1 or 2, wherein said etching agent contains 0.1–200 parts by weight of tetramethylammonium hydroxide per 100 parts by weight of the etching assistant.

5. An etching agent according to claim 1 or 2, wherein said etching agent contains 0.5–50 parts by weight of tetramethylammonium hydroxide and 20–1,000 parts by weight of water per 100 parts by weight of the etching assistant.

6. An etching agent according to claim 1 or 2, wherein said at least one amine compound is selected from methylenediamine, ethylenediamine, trimethylenediamine, propylenediamine, tetramethylenediamine, hexamethylenediamine, pentamethylenediamine, and dimethylenediamine.

7. An ething agent according to claim 1 or 2, wherein said at least one amide compound is selected from the compounds represented by the formula:

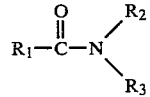

wherein $R_1$ is a hydrogen atom or an alkyl group having one or more carbon atoms, and $R_2$ and $R_3$ are alkyl groups having one or more carbon atoms.

8. An etching agent according to claim 6, wherein the amide compound is selected from N,N-dimethylformamide; N,N-diethylformamide; N,N-dimethylacetamide; N,N-dimethylpropionamide; N,N-dimethylbutyramide; N,N-ethylbenzamide; and diethylcarbamazine.

9. An etching agent according to claim 8, wherein said at least one amine compound is selected from ethylenediamine and hexamethylenediamine.

10. An etching agent according to claim 6, wherein the amide compound is N,N-dimethylacetamide.

11. A process for etching a polyimide type resin which comprises contacting an etching agent consisting essentially of (1) tetramethylammonium hydroxide or an aqueous solution of tetramethylammonium hydroxide and
(2) an etching assistant consisting of
  (a) at least one amine compound represented by the formula, $$H_2N-R_6-NH_2,$$

wherein $R_6$ is an alkyl group having one or more carbon atoms, and
  (b) at least one amide compound selected from the group consisting of compound represented by the formula

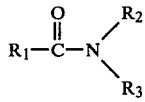

wherein $R_1$ is a hydrogen atom or an alkyl group having one or more carbon atoms and $R_2$ and $R_3$ are alkyl groups having one or more carbon atoms, and the formula

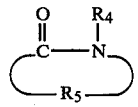

wherein $R_4$ and $R_5$ represent alkyl groups having one or more carbon atoms,
with a coating or film of the polyimide type resin to etch a part of said coating or film of the polyimide type resin.

12. An etching process according to claim 11, wherein said coating of film of the polyimide type resin is of a cured product of a polyimide type resin.

13. An etching process according to claim 11, wherein said coating or film of the polyimide type resin is of a semi-cured product of a polyimide type resin.

14. An etching process according to claim 11, 12 or 13, wherein said coating or film of the polyimide type resin is a protecting film on the surface of a semi-conductor.

15. An etching process according to claim 11, 12 or 13, wherein said coating or film of the polyimide type resin is a polyimide type resin film of carrier tape of IC, LSI or the like.

16. An etching process according to claim 11, 12 or 13, wherein the contact of said coating or film of the polyimide type resin with said etching agent is effected by immersing the former in the latter.

17. An etching process according to claim 14, wherein the contact of said coating or film of polyimide type resin with said etching agent is effected by immersing the former in the latter.

18. An etching process according to claim 11, 12 or 13, wherein the contact of said coating or film of the polyimide type resin with said etching agent is effected by spraying the latter against the former.

19. An etching process according to claim 14, wherein the contact of said coating or film of polyimide type resin with said etching agent is effected by spraying the latter against the former.

20. An etching process according to claim 16, wherein said etching agent has a temperature of 40°–80° C.

21. An etching process according to claim 18, wherein said etching agent has a temperature of 40°–80° C.

* * * * *